US008996937B2

(12) United States Patent
Jain et al.

(10) Patent No.: US 8,996,937 B2
(45) Date of Patent: Mar. 31, 2015

(54) APPARATUS FOR MONITORING OPERATING CONDITIONS OF A LOGIC CIRCUIT

(75) Inventors: Abhishek Jain, Delhi (IN); Chittoor Parthasarathy, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 393 days.

(21) Appl. No.: 13/489,034

(22) Filed: Jun. 5, 2012

(65) Prior Publication Data
US 2013/0169331 A1   Jul. 4, 2013

(30) Foreign Application Priority Data

Dec. 29, 2011   (IN) .......................... 3871/DEL/2011

(51) Int. Cl.
*G06F 11/16* (2006.01)
(52) U.S. Cl.
CPC .................................. *G06F 11/1608* (2013.01)
USPC .......................................................... 714/724
(58) Field of Classification Search
CPC ... G06F 11/165; G06F 11/26; G06F 11/3089; G06F 11/1608; G06F 9/3869; G01R 31/318516; G05B 23/0256; H03K 3/0375
USPC ......... 714/37, 39, E11.024, 47.1, 48, 49, 724; 326/93
See application file for complete search history.

(56) References Cited

U.S. PATENT DOCUMENTS

| 5,453,990 | A | * | 9/1995 | Aoki et al. ..................... 714/712 |
| 5,533,037 | A | * | 7/1996 | Shah et al. ..................... 714/815 |
| 5,848,238 | A | * | 12/1998 | Shimomura et al. ............ 714/49 |
| 6,751,753 | B2 | * | 6/2004 | Nguyen et al. .................. 714/39 |
| 8,018,867 | B2 | * | 9/2011 | Kawai et al. .................. 370/252 |
| 8,762,792 | B2 | * | 6/2014 | Greb et al. ..................... 714/47.1 |
| 2010/0083057 | A1 | * | 4/2010 | Laxminarayanan ............ 714/48 |
| 2012/0311620 | A1 | * | 12/2012 | Conklin et al. .................. 725/14 |

OTHER PUBLICATIONS

Agarwal, Mridul et.al., "Circuit Failure Prediction and its Application to Transistor Aging", 25th IEEE VLSI Test Symposium 2007, May 6-10, 2007, 8 pages.
Bull et. al., "A Power-Efficient 32 bit ARM Processor Using Timing-Error Detection and Correction for Transient-Error Tolerance and Adaptation to PVT Variation", IEEE Journal of Solid-State Circuits, Vol. 46, No. 1, Jan. 2011, 14 pages.
Keith A. Bowman et al., "Energy-Efficient and Metastability-Immune Timing-Error Detection and Recovery Circuits for Dynamic Variation Tolerance", IEEE International Conference on Solid-State Circuits, Feb. 2008. ISSCC 2008, 4 pages.

* cited by examiner

*Primary Examiner* — Phung M Chung
(74) *Attorney, Agent, or Firm* — Gardere Wynne Sewell LLP (57) ABSTRACT

An embodiment of a circuit includes a data latch and a plurality of cascaded latches, wherein a first of the plurality of cascaded latches is configured to receive a first signal from the data latch and each subsequent cascaded latch is configured to receive a data output signal of a preceding cascaded latch, and an error-detection circuit configured to receive the respective data output signals and detect error in operation of the cascaded latches based thereon.

20 Claims, 7 Drawing Sheets

APPARATUS FOR MONITORING OPERATING CONDITIONS OF A LOGIC CIRCUIT

PRIORITY CLAIM

The instant application claims priority to Indian Patent Application No. 3871/DEL/2011, filed Dec. 28, 2011, which application is incorporated herein by reference in its entirety.

TECHNICAL FIELD

Embodiments relate to monitoring circuits. Particularly, but not exclusively, embodiments relate to the detection of the proximity of a latch to operational failure.

BACKGROUND

In order to optimize the operation of a system, a system may make use of dynamic voltage and frequency scaling. In such a system, parameters may be scaled in order to, for example, optimize performance and accuracy or minimize power consumption. In such a system, factors such as, for example, system voltage and frequency may be scaled to drive the system closer to failure in order to make power savings. For example, parameters of flip-flops in a critical path may be adjusted to drive the flip-flops closer to failure in order to reap the benefits of reduced power consumption. Such parameter adjustment may increase the chance of a flip-flop failing (or operating in error). In some systems, additional circuitry is provided to indicate a proximity of a flip-flop to failure, and the system parameters may be adjusted so that the chance of failure is acceptable in terms of the expected performance of the system.

An example of such additional circuitry is a canary flip-flop. Canary flip-flops may be implemented in conjunction with a data flip-flop, and may generate a warning that a data flip-flop is close to failure. In some examples, the system parameters may then be adjusted to prevent the failure of the data flip-flop. A balance should be found between the area and power required by the additional canary cell and the performance advantages that such a cell can afford.

SUMMARY

According to an embodiment, there is provided a circuit, including: a data latch; and a plurality of cascaded latches wherein a first of the plurality of cascaded latches is configured to receive a first signal from the data latch and the latch, or each subsequent cascaded latch, is configured to receive a data-output signal of a preceding cascaded latch; and an error-detection circuit configured to receive the respective data output signals and detect error in operation of the cascaded latches based thereon.

The circuit may be configured to determine how close the data latch is to failure based on the detected errors. The data latch may be a master/slave latch. The first signal may be output from the master latch. The slave latch may be configured to receive an enable signal, and the master latch is configured to receive an inverse of the enable signal. The data latch may be pulse triggered. The error-detection circuit may further receive a data-latch output signal from the slave latch. The error-detection circuit may be configured to detect an error in operation of a respective cascaded latch by comparing the data-output signal from the respective cascaded latch to the data-latch output signal.

The circuit may further include a monitoring-circuit test mode wherein the first signal is the inverted output signal from the master latch. It may be determined that the monitoring circuit is operating correctly if an error is detected in the operation of all the cascaded latches. The circuit may further include a multiplexor for selecting the output of the master latch as the first signal when the circuit is in a normal mode of operation, and selecting the inverse output of the master latch as the first signal when the circuit is in the test mode. The master latch and the plurality of cascaded latches may be configured to receive a common enable signal. In response to a first value of the enable signal, an output of each of the master latch and plurality of cascaded latches may follow an input of the respective each of the master latch and plurality of cascaded latches, and in response to a second value of the enable signal, the output of each of the master latch and plurality of cascaded latches may be held at a respective value.

According to another embodiment, a method includes: receiving a first signal from a data latch by a first of a plurality of cascaded latches; receiving a data-output signal of a preceding cascaded latch by the latch, or by each subsequent cascaded latch; and receiving the respective data-output signals from each of the plurality of cascaded latches with an error-detection circuit; and detecting an error in operation for the cascaded latches based thereon.

According to another embodiment, there is provided circuitry for monitoring an error margin of a data latch, the circuitry including: at least two cascaded latches configured to propagate a signal corresponding to a data-input signal of the data latch, wherein each of the at least two cascaded latches introduces a respective delay into the signal; and an error-detection circuit configured to detect an error in operation for the at least two cascaded latches based on a respective output from each latch.

According to another embodiment, there is provided a method for monitoring an error margin of a data latch, the method including: propagating a signal corresponding to a data-input signal of the data latch through at least two cascaded latches, wherein the step of propagating includes introducing a respective delay into the signal by each of the at least two cascaded latches; and detecting an error in operation for the at least two cascaded latches based on a respective output from each latch.

According to another embodiment, there is provided a method including: receiving respective data outputs from a plurality of cascaded latches, wherein a first of the plurality of cascaded latches receives an output of a data latch and the remaining latches of the plurality of cascaded latches receive the respective data output from a preceding one of the plurality of cascaded latches; and detecting an error in operation for each of the plurality of cascaded latches.

According to another embodiment, there is provided circuitry for monitoring an error margin of a data latch, the circuitry including: at least two cascaded latching means for propagating a signal corresponding to a data-input signal of the data latching means and introducing a respective delay into the signal; and an error-detection means for detecting an error in operation of the at least two cascaded latching means based on a respective output from each latching means.

According to another embodiment, there is provided a circuit including: a first latching means of a plurality of cascaded latching means for receiving a first signal from a data latching means; each subsequent cascaded latching means of the plurality of cascaded latching means for receiving a data-output signal of a preceding one of the cascaded latching means; and error-detection means for receiving the respective data-output signals from each of the plurality of cascaded latching means and detecting an error in operation for the cascaded latching means based thereon.

BRIEF DESCRIPTION OF THE DRAWINGS

Embodiments will be described with the reference to the following figures in which:

FIG. 3b shows a signal diagram of a window of the FIG. 3a;

DETAILED DESCRIPTION

One or more embodiments of the present application may provide a monitoring circuit to be implemented in conjunction with a data latch. The monitoring circuit may monitor data clocked through the data latch and provide an indication of a proximity of the data latch to failure due to, for example, a supply voltage that is near the minimum supply voltage required for proper operation of the data latch.

Figure 1:
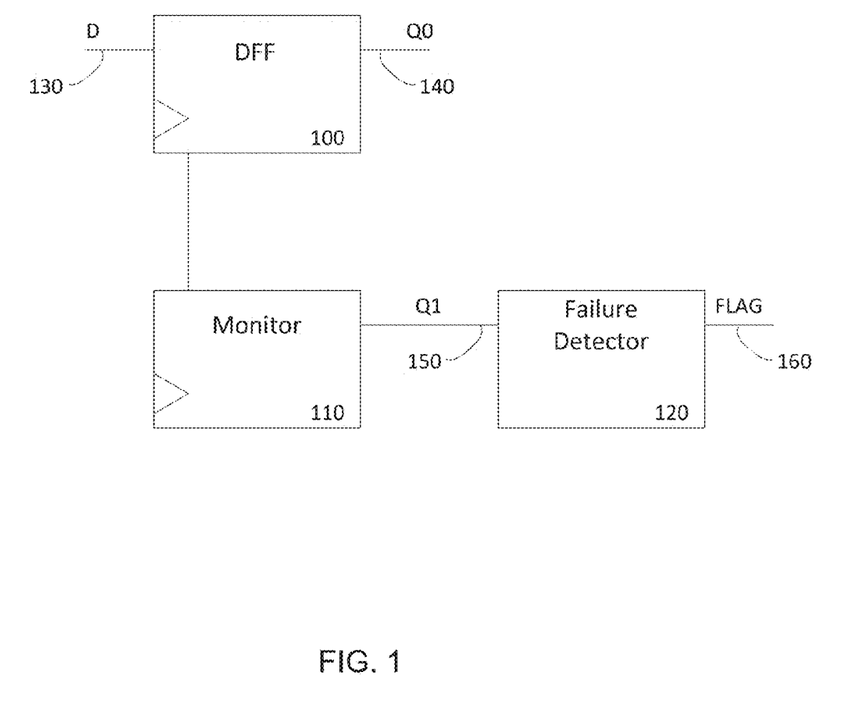
FIG. 1 shows an example of a monitoring circuit implemented in conjunction with a data latch.

FIG. 1 shows an example of a data latch 100 and monitoring circuit 110. The data latch 100 may receive a data signal D on a data-signal input 130 and output a data-output signal Q0 on an output 140. The data latch may also receive a clock or enable signal at a clock or enable input (not shown).

In operation, the data latch 100 may output a value on the output signal Q corresponding to a value of the data-input signal D in response to a transition of the clock/enable signal. In some embodiments, the transition may be a rising edge, falling edge, or rising and falling edge of the clock/enable signal. The output signal Q may be held at this value until the next operable transition of the clock/enable signal. In this manner, data may propagate through a series of data latches.

In this manner, the data latch may be single-edge triggered. In some embodiments, the data latch may be a master-slave data-pulse-triggered latch and sample the input data on a first edge of the clock/enable signal and output data on an opposite edge of the clock/enable signal.

In order for the value of the data signal D to be output correctly, a transition on the data signal may adhere to set up and hold times of the data latch. For example, a latch may require that a value on the data signal D be held stable for a period of time before and/or after a transition (or operable edge) of the clock/enable signal. The area around an operable edge of the clock/enable signal in which a data transition may lead to incorrect operation of the data latch 100 may be an error window. It will be appreciated that this window may be an area of time before the operable edge, after the operable edge, or both before and after the edge.

Initially, a system may be designed with parameters such that a data-signal transition may be safely outside the window for error. However factors such as dynamic voltage and frequency scaling, process variation, and component aging may affect the proximity of a data-signal transition to the error window. In some systems, adjusting system parameters so that the proximity of a data transition to the error window is decreased may improve system characteristics such as power consumption.

A monitoring circuit 110 may be provided in order to monitor the likelihood of failure of the data latch 100. The monitoring circuit 110 may monitor, for example, the proximity of a transition of a data signal to the error window. In this manner, in some embodiments, a minimum error margin may be set for the system. An error margin may be a measure of how close the data latch is to failure. For example, a proximity of a data transition to the error window may be indicative of the margin available.

In the example of FIG. 1, the monitoring circuit 110 may include latch circuitry. The monitoring circuit 110 may receive the data-input signal and provide a second data-output signal Q1. The data-output signal Q1 may be provided to a failure detector 120. The failure detector may determine whether an error or failure has occurred at the monitoring circuit 110, and generate a flag. For example, the failure detector may determine whether the monitoring circuit 110 has clocked out a value of the data signal D incorrectly. The monitoring circuit 110 may be adjusted to be closer to failure than the data latch 100. For example, the data latch 100 and the monitoring circuit 110 may be subject to similar operating conditions. If the system parameters are adjusted to drive the data latch and monitoring circuit closer to failure, then the monitoring circuit will fail before the data latch. This may be, for example, because the monitoring circuit 110 may have, for example, a wider error window and/or the data signal to the monitoring circuit may be delayed (the proximity of the data transition to the window may be reduced).

It will be appreciated that the monitoring circuit may not receive the data signal D directly as an input, and in some embodiments may receive a signal from the data latch 100. This signal may correspond to a latched data-input signal in some embodiments. It will also be appreciated that the flag may be provided to circuitry for adjusting system parameters and/or may be monitored or recorded by other circuitry.

In order to provide monitoring of how close a data latch is to failure, embodiments may make use of cascaded latches. Each latch in the cascade may be more likely to fail than the previous latch, and a state of the data latches proximity to failure may be determined based on which latches in the cascade have been determined to have failed and which have not. For example, the latches may be cascaded such that an output of a latch provides an input for a successive latch in the cascade. In this manner, a signal may be propagated through the latches. The signal may contain data transitions corresponding to the data transitions on the data-input signal. Each latch may introduce a delay into the propagated signal. For example, each latch may delay a data transition on the propagated signal.

In this manner, a data transition on the propagated signal occurs closer and closer to the time of operation of the cascaded latches. The time of operation may be, for example, a clock edge at which input data is clocked out of a latch. In this manner, each successive latch is more likely to fail than the previous latch.

The first latch of this cascade may be a master latch of data latch 100. The remaining latches in the cascade may form part of the monitoring circuitry 110. In some embodiments an error detector may receive the outputs of the cascaded latches and determine whether the latches have clocked data out erroneously. The outputs of the latches may be used to determine, for example, if the data latch is operating with optimum margins, if the data latch can be brought closer to failure, if the data latch is operating too close to failure and the margins should be increased, and/or if the monitoring circuit is operating incorrectly. In some embodiments, the data latch 100 and monitoring circuitry 110 may have a test mode in which the monitoring circuitry can be tested for correct operation.

Figure 2:
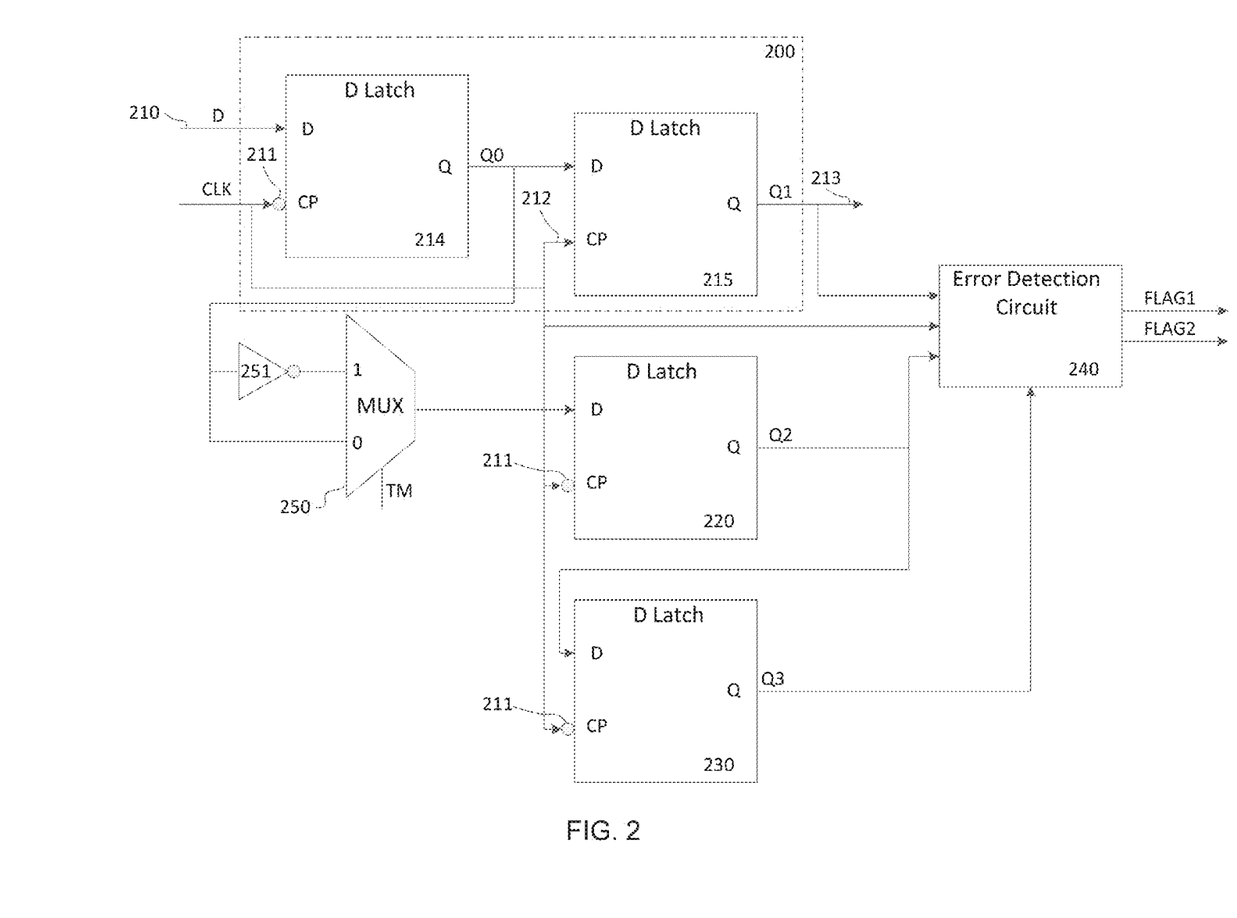
FIG. 2 shows a data latch and monitoring circuit according to an embodiment.

FIG. 2 shows an embodiment of the monitoring circuit and data latch including cascaded latches. FIG. 2 includes a data-latch circuit 200. The data-latch circuit 200 includes a master/slave latch. The master/slave latch is made up of a first data latch 214 and a second data latch 215. The first data latch 214 receives a data-input signal D over a data input 210 and outputs an initial data-output signal Q0. The initial data-output signal Q0 forms a data input to the second data latch 215. The second data latch provides a first data-output signal Q1 on a data output 213. The first data latch 214 may also receive an inverted clock signal 211 while the second data latch receives a clock signal 212.

The monitoring circuit of FIG. 2 includes a first monitoring latch 220, a second monitoring latch 230, an error-detection circuit 240, and a multiplexor 250. The inverted clock signal 211 is provided to the first 220 and second 230 monitoring latches as a clock/enable input. The initial output Q0 from the first data latch 214 provides a first input to the multiplexor 250 and the initial output Q0 inverted by inverter 251 is provides a second input to the multiplexor 250. The multiplexor 250 may also receive a test-mode select TM.

The multiplexor 250, inverter 251, inverted Q0 input and test-mode select provide a selection for a test mode of the monitoring latches and associated circuitry. It will be appreciated that this test-mode circuitry may be optional in embodiments without test-mode capabilities. In embodiments without test-mode capabilities, the initial output Q0 may be provided directly to an input of the first monitoring latch. An output from the multiplexor 250 is provided to the first monitoring latch 220 as a data input. The first monitoring latch 220 also receives the inverted clock signal 211 as an enable/clock input and provides a second data-output signal Q2 to the error-detection circuit 240. The second data-output signal Q2 is also provided to the second monitoring latch 230 as a data input. The second monitoring latch 230 receives the inverted clock signal 211 as an enable-clock input and provides a third data-output signal Q3 to the error-detection circuit 240.

The first data latch 214, first monitoring latch 220, and second monitoring latch 230 may be coupled in a cascade with an output from a latch being provided as an input to a successive latch in the cascade. It will be appreciated that the cascade of latches may include more than these three latches as discussed in relation to FIG. 4. The error-detection circuit 240 may receive the first data-output signal Q1, the second data-output signal Q2, the third data-output signal Q3, clock signal 212, and a reset-flag RNF signal (not shown in FIG. 2) and provide a first and second flag. The first flag may correspond to a failure of the first monitoring latch 220, and the second flag may correspond to a failure of the second monitoring latch 230.

The reset flag signal RNF may be used to reset the first and second flag after their generation. It will be appreciated that this is by way of example only, and the first and second flag may be generated by any suitable means that may or may not encompass a reset-flag signal. It will also be appreciated that the generation of the first and second flags may be by way of example only, and the error-detection circuit may generate any suitable indication that an error has been detected. For example a bit may be set, signal asserted and/or deasserted, interrupt generated, and/or any indication may be generated.

In operation, the data-latch circuit 200 operates as a master/slave latch. The first data latch 214 samples the data-input signal D on the rising edge of the clock 212 (falling edge of the inverted clock 211) and the second data latch 215 outputs the sampled value of the first data-output signal Q1 on the falling edge of the clock signal 212 (rising edge of the inverted clock 211). In this manner, the data-input signal D is propagated through the data-latch circuit 200.

The initial data output Q0 then propagates through the first monitoring latch 220 to provide a second data output Q2, which propagates through the second monitoring latch 230. It will be appreciated that the signal that propagates through the cascaded latches 214, 220, and 230 corresponds to the data-input signal D of the data latch and includes the data transition of that signal. The signal may be modified by each successive latch.

Each of the first data latch 214, the first monitoring latch 220, and the second monitoring latch 230 provide a delay in their respective output-data signals due to the propagation through the latch. In this manner, for each latch of 214, 220, and 230, a data transition in the latch's data-output signal is closer to an operable clock edge than the data transition in the latch's data-input signal. In other words, each latch delays the data transition closer to the error window for the latch.

In the circuit of FIG. 2, each of the successive latches 214, 220, and 230 are more likely to fail than the previous latch due to this cumulative delay. The error-detection circuit 240 may generate flags corresponding to a failure of each latch, and may determine a margin available for scaling of the system parameters.

Figure 3A:
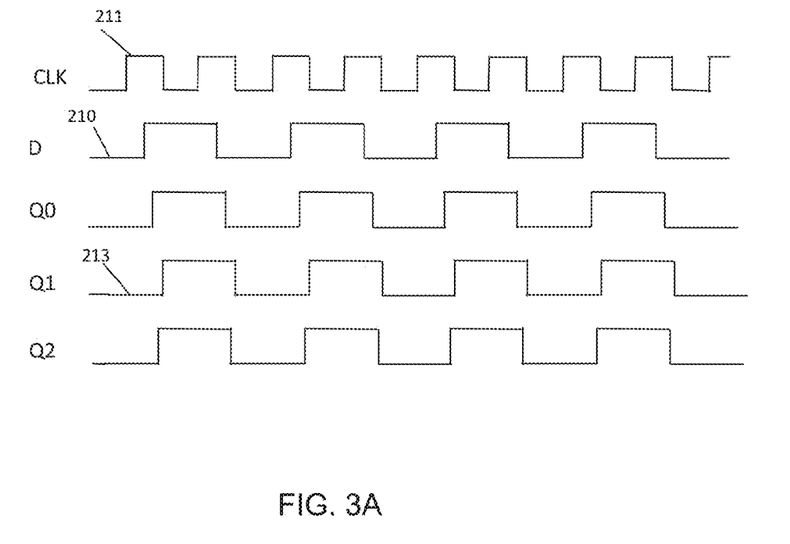
FIG. 3a shows a signal diagram of an example operation of an embodiment.
Figure 3B:
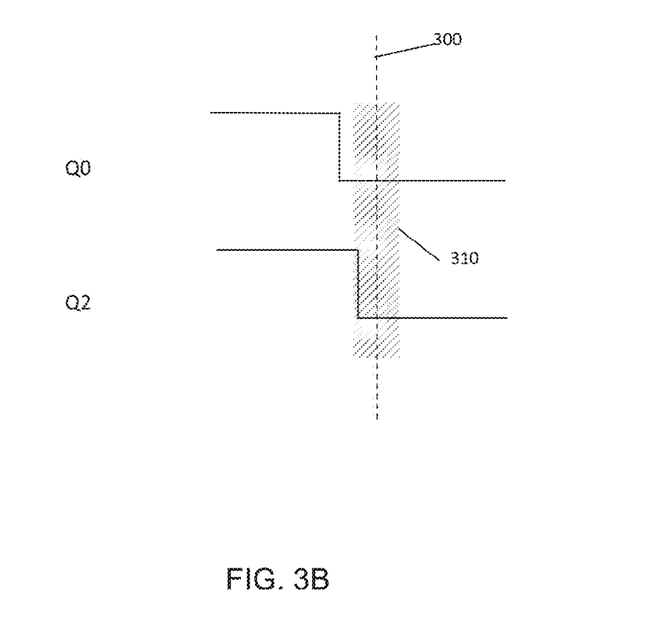

The operation of the circuit of FIG. 2 will now be discussed with reference to the signal diagrams of FIGS. 3a and 3b. FIGS. 3a and 3b show a normal mode of operation of the circuitry of FIG. 2. In circuitry that supports the test mode, the normal mode of operation may occur when the test-mode-select signal of multiplexor 250 is asserted to select the initial output Q0 to be input to the first monitoring latch 220.

FIG. 3a shows the inverted clock signal 211, the data-input signal D at the data input 210 of the first data latch 214, the initial data-output signal Q0, the first data-output signal Q1, the second data-output signal Q2, and the third data output signal Q3.

The first data latch receives the inverted clock signal 211 and is enabled when the clock signal is low, whereas the second data latch 215 receives the clock signal 212 and is enabled when the clock signal is high. In other words, the initial output Q0 follows the value of the data-input signal D when the inverted clock 211 is high and remains unchanged when the inverted clock signal 211 is low. Similarly the first 220 and second 230 monitoring latches are clocked by the inverted clock signal 211, and their data-output signals behave accordingly. Conversely, the first data-output signal Q1 follows the value of the data-input signal D when the inverted clock 211 is low, and remains unchanged when the inverted clock signal 211 is high.

It will be appreciated that the specific timing of the circuitry is by way of example only, and the latches may be clocked oppositely or may be enabled on a low clock input instead of a high one. For example, the master latch and cascaded latched may be operable on the falling edge of the clock and the slave latch operable on the rising edge of the clock.

It can be seen from FIG. 3a that the initial output Q0 follows the value of the data-input signal D when the inverted clock 211 is high and remains unchanged when the inverted clock signal 211 is low. The first data latch 214 may introduce a delay into the initial output due to internal logic gates of the first data latch.

The first monitoring latch 220 receives the initial data-output signal Q0. The second data-output signal Q2 (the output of the first monitoring latch 220) follows Q0 when the inverted clock 211 is high and remains unchanged when the inverted clock signal 211 is low. Because the first data latch 214 introduced a delay into the initial data output signal Q0, a data transition on the data-signal input to the first monitoring latch 220 is closer to the operable edge of the clock than the data transition of the data-input signal 210 into the first data latch 214. The first monitoring latch 220 may, therefore, be closer to failure than the first data latch 214.

The second monitoring latch 230 receives the second data-output signal Q2. The third data-output signal Q3 (the output of the second monitoring latch 230) follows Q2 when the inverted clock 211 is high, and remains unchanged when the inverted clock signal 211 is low. Because the first monitoring latch introduces a delay into the second data-output signal Q2, the data transition on the data signal input to the second monitoring latch 230 is closer to the operable edge of the clock than the data transition of the initial data-output signal Q0 input into the first monitoring latch. The second monitoring latch 230 is, therefore, closer to failure than the first monitoring latch 220.

FIG. 3b shows an enlarged view of a data transition on the initial data-output signal Q0 and the second data-output signal Q2 around a falling edge 300 of the inverted clock signal 211. An example of a window for error 310 is shown as the shaded area. It will be appreciated that the error window may be the area in which a transition of a data-input signal may cause an error.

It can be seen in FIG. 3b that due to the delay introduced by the first monitoring latch 220, the data transition on the data-input signal Q2 of the second monitoring latch 230 falls within the error window. The third data-output signal Q3 may, therefore, contain errors.

The error-detection circuit 240 may receive the first Q1, second Q2, and third Q3 data-output signals and generate indications of whether an error is present in the second and third data-output signals. In some embodiments, the indications are flags. The error-detection circuit may determine whether an error is present on the second and third data output signals Q2 and Q3 by comparing those signals to the first data-output signal Q1. In some embodiments, the same order of data values are expected on the three data-output signals. If a data value of a subsequent data-output signal differs from the corresponding value on the first data-output signal Q1, it may be determined that an error is present on the subsequent data output signal.

A detected error in one of the data-output signals may indicate that the corresponding latch has failed to latch out data correctly. The error-detection circuit may be used to determine a state of the data latch. For example, the error-detection circuit 240 may determine whether the operating margins are such that the data latch 200 is prone to failure, if the operating margins are optimum, or if there is room to further reduce the operating margins. For example, if neither the first 220 nor the second 230 monitoring latches have failed, the error-detection circuit 240 may determine that the operating margins (proximity to failure) of the data latch 200 may be further reduced. If both the first 220 and the second 230 monitoring latches have failed, it may be determined that failure of the data latch 200 is likely, and the margins may be adjusted to reduce the risk of failure. If the first monitoring latch 220 operates without failure and the second monitoring latch 230 fails, it may be determined that the margins are optimum.

If the second monitoring latch 230 has not failed, but the first monitoring has failed, it may be determined that the monitoring circuitry is not operating correctly. It will be appreciated that the flags may be used to carry out a test on the monitoring circuitry in this manner to determine if the circuitry is faulty. It will be appreciated that the error-detection circuit 240 may not carry out these determinations and may provide the flags to further circuitry, which may carry out these determinations.

In some embodiments, the data latch and monitoring circuitry may include a test mode of operation. In test mode, the test-mode-select signal of the multiplexor 250 may be asserted to provide the inverted initial data output Q0 to the data input of the first monitoring latch 220. The first monitoring latch 220 latches the inverted initial data output Q0 and provides the second data output Q2 to the second monitoring latch 230. The second monitoring latch 230 latches this input similarly.

In the test mode of operation, the first and second monitoring latches 220 and 230 are provided with the opposite values of the data-input signal D to the data latch. In this case, the first and second monitoring latches are expected to be determined to fail if they are operating correctly, as they will be latching out the opposite values to the data-input signal; D.

The error-detection circuit may determine whether the second data output Q2 and the third data output Q3 correspond to the first data output Q1. If they do not, it is determined that the monitoring latches 220 and 230 are operating correctly.

It will be appreciated that the flags or indications generated by the error-detection circuit 240 may be provided to further circuitry that may carry out operation such as logging the error history, adjusting parameters through, for example, voltage and frequency scaling to drive the data latch closer and/or further to failure and determining whether the monitoring circuitry is operating correctly.

In some embodiments, the flags or other indications generated may indicate the following states of the data latch (where indication 1 indicates error in the first monitoring latch and indication 2 indicates an error in the second monitoring latch):

TABLE 1

| Mode of Operation | Indication 1 | Indication 2 | State |
|---|---|---|---|
| Normal | 0 | 0 | There is room for reducing the error margins to bring the data latch closer to failure |
| Normal | 0 | 1 | The error margins are optimum |
| Normal | 1 | 1 | The data latch is prone to failure, the error margins should be increased to bring the data latch further from failure |
| Normal | 1 | 0 | The monitoring circuitry is operating incorrectly |
| Test | 1 | 1 | The monitoring circuitry is operating correctly |
| Test | 0 | 0 | The monitoring circuitry is operating incorrectly |

It will be appreciated that in some embodiments, an error margin may be increased during test mode. For example, dynamic voltage and frequency scaling may increase an error margin so that the first and second monitoring latches operate correctly during the test mode. In other words, margins are increased to ensure that data transitions in the latches are not too close to a clock edge. In this manner, it can be expected that flags will be raised for both monitoring latches if the circuitry of the latches is operating correctly.

It will be further appreciated that the monitoring circuitry of the embodiments may include more than two monitoring latches. The latches may be cascaded and the resulting generated flags may be used to determine if the operating margins are optimum for varying performance requirements. For example, four cascaded monitoring latches may be provided with the optimum margins being determined for three latches in failure for some performance requirements or modes and for two latches in failure for other performance requirements or modes.

Figure 4:
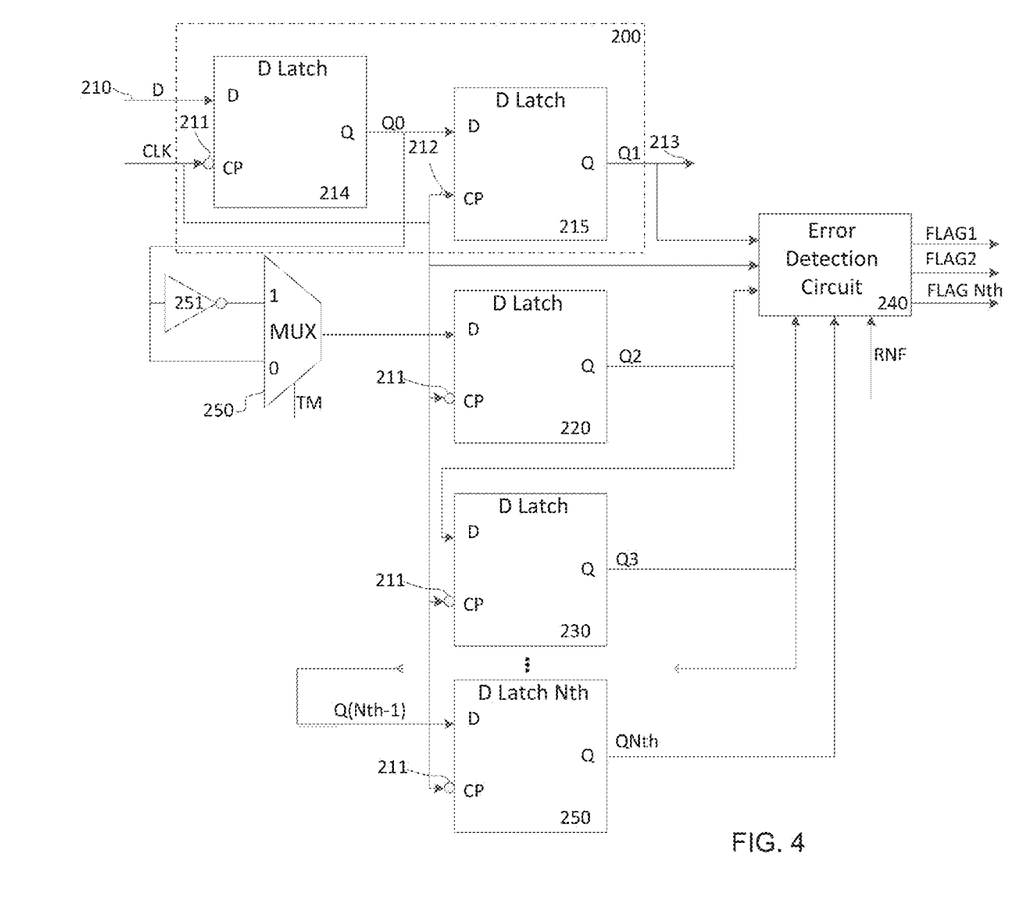
FIG. 4 shows a data latch and monitoring circuit according to a further embodiment.

FIG. 4 shows an embodiment with more than two monitoring latches. FIG. 4 includes similar circuitry to that of FIG. 3, with the addition of N more monitoring latches 250. Each additional monitoring latch N may receive the data-output signal Q(N-1) and provide a data-output signal QN. It will be appreciated that in some embodiments a corresponding number of flags are generated.

Each of the cascaded latches may introduce a delay in the signal being propagated through the cascade. The delay may correspond to the delays caused by internal nodes in the latches. The number of latches may be determined based on the system requirements. For example, the balance between how many levels of power savings versus tendency to fail may be a consideration. For example, four cascaded latches may provide, for example, three levels of power saving vs. tendency to failure—a first level of high power savings where the first latch after the master latch in the cascade does not fail but successive latches do, up until a third level where only the last latch in the cascade fails, indicating that the data latch is far from failure.

Figure 5A:
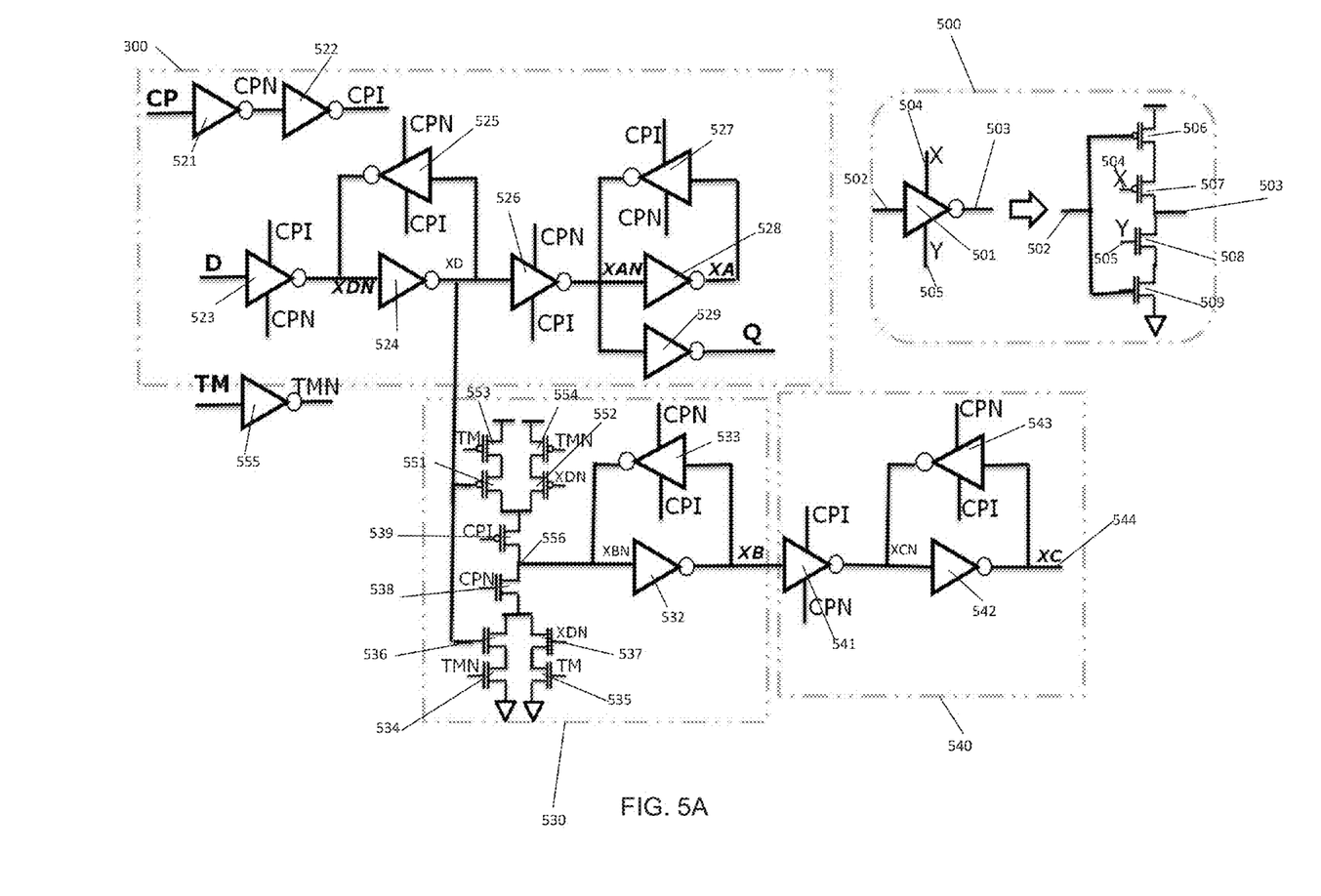
FIG. 5a shows an embodiment of a data latch and first and second latch.
Figure 5B:
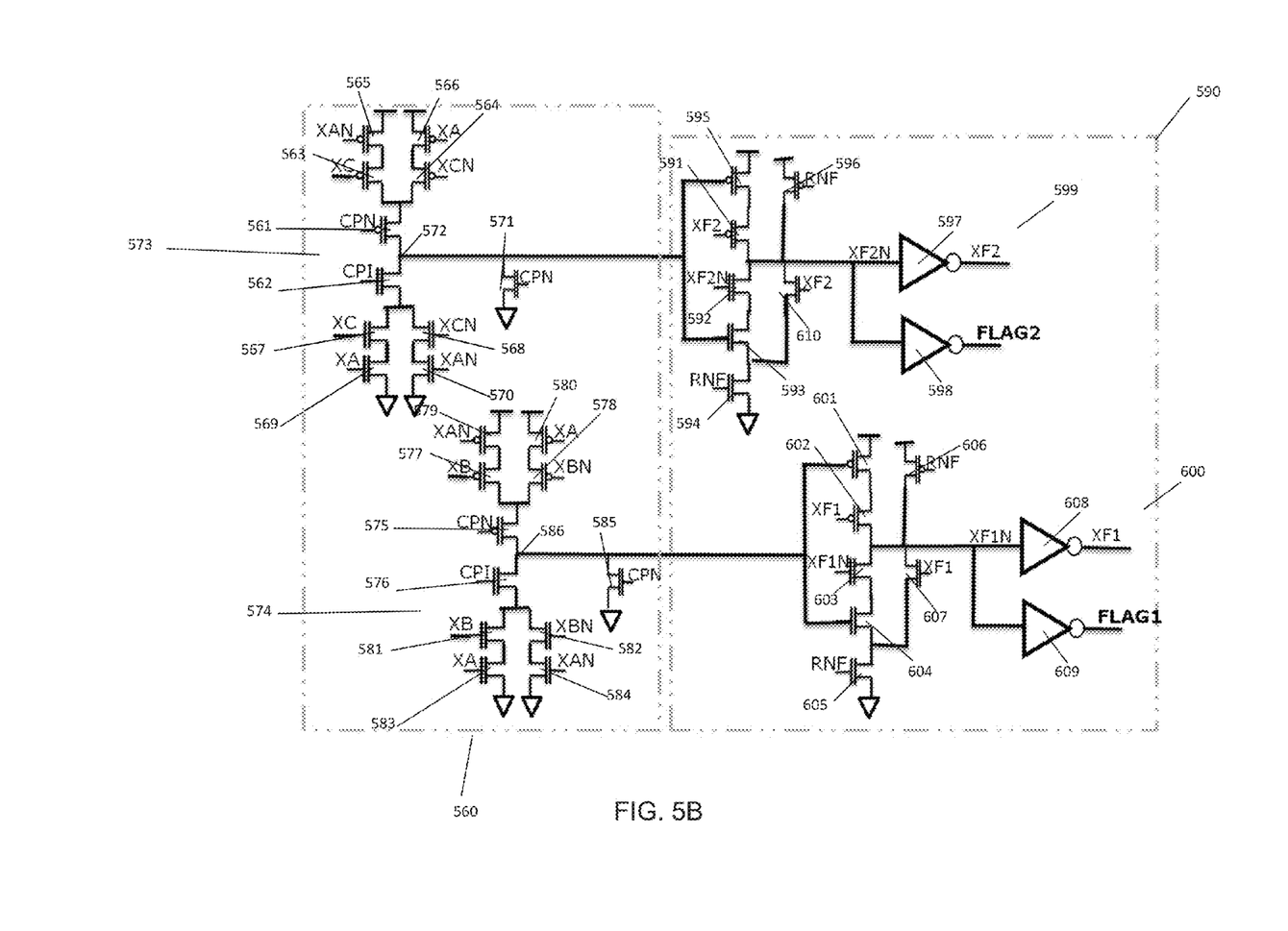
FIG. 5b shows an embodiment of an error detection circuit.

It will be appreciated that various circuitry may be used to implement the latches as described herein. FIGS. 5a and 5b provide an example of the circuitry used to implement some embodiments. It will be appreciated that this is by way of example only, and a variety of circuitry may be used to implement the latches.

FIG. 5a shows an example of an implementation of a data latch 200, first latch 220, and second latch 230, as well as multiplexor 250, and inverter 251. In the embodiment of FIG. 5, the latches include tristate inverters. The block 500 depicts an example of a tristate inverter 501. The tristate inverter 501 has a first input 502 and an output 503. The tristate inverter 501 also receives a first control input X 504 and a second control input Y 505. The tristate inverter may include a first p-channel transistor 506 with its source terminal coupled to a voltage source and its drain terminal coupled to a source terminal of a second p-channel transistor 507. A gate terminal of the first p-channel transistor 506 is coupled to the input 502 and a gate terminal of the second p-channel transistor 507 is coupled to the first control input X 504.

A drain terminal of the second p-channel transistor 507 is coupled to a drain terminal of a first n-channel transistor 508 as well as to the output 503. A gate terminal of the first n-channel transistor 508 is coupled to the second control input Y 505 and a source terminal is coupled to a drain terminal of a second n-channel transistor 509. A source terminal of the second n-channel transistor 509 is coupled to ground and a gate terminal is coupled to the input 502.

When the first control input X 504 is low and the second control input Y 505 is high, the second p-channel transistor and the first n-channel transistors are capable of turning on and the tristate inverter 501 is in an on state. In the on state, when the input is high, the first p-channel transistor 506 is off and the second n-channel transistor 509 is on. The on first and second n-channel transistors 508 and 509 pull the output 503 low and the high input 502 is inverted as a low output 503.

When the input is low in the on state, the first p-channel transistor 506 is on and the second n-channel transistor 509 is off. The on first and second p-channel transistors 506 and 507 pull the output 503 high and the low input 502 is inverted to provide the high output 503.

When the first control input X 504 is high and the second control input Y 505 is low, the tristate inverter is in an off state and provides no output. In order to provide control inputs for the tristate inverters making up the latches of FIG. 5, a clock pulse is inverted by a first clock inverter 521 to provide an inverted clock pulse signal CPN and the signal CPN is inverted by a second clock inverter 522 to provide a double inverted clock pulse signal CPI.

In FIG. 5, the data latch 200 is provided by a master latch and a slave latch. The master latch includes a first tristate inverter 523, second tristate inverter 525, and a first inverter 524. The first tristate inverter 523 receives the data signal D as input and provides an output to the first inverter 524. The first tristate inverter 523 also receives a first control input CPI and a second control input CPN. An output of the first inverter provides a signal XD and is coupled to an input of the second tristate inverter 525. The second tristate inverter 525 receives a first control input CPN and a second control input CPI. An output of the second tristate inverter 525 is coupled to the input of the first inverter 524. The signal at the input to the first inverter 524 provided by the first and second tristate inverters is XDN.

The slave latch includes a first tristate inverter 526, second tristate inverter 527, and a first inverter 528. The first tristate inverter 526 receives the signal XD as input and provides an output to the first inverter 528. The first tristate inverter 526 also receives a first control input CPN and a second control input CPI. An output of the first inverter 528 provides a signal XA and is coupled to an input of the second tristate inverter 527. The second tristate inverter 527 receives a first control input CPI and a second control input CPN. An output of the second tristate inverter 527 is coupled to the input of the first inverter 528. The signal at the input to the first inverter 528 provided by the first and second tristate inverters 526 and 527 is XAN. The slave latch further includes a second inverter 529, which receives the signal XAN and provides the output Q.

Figure 6:
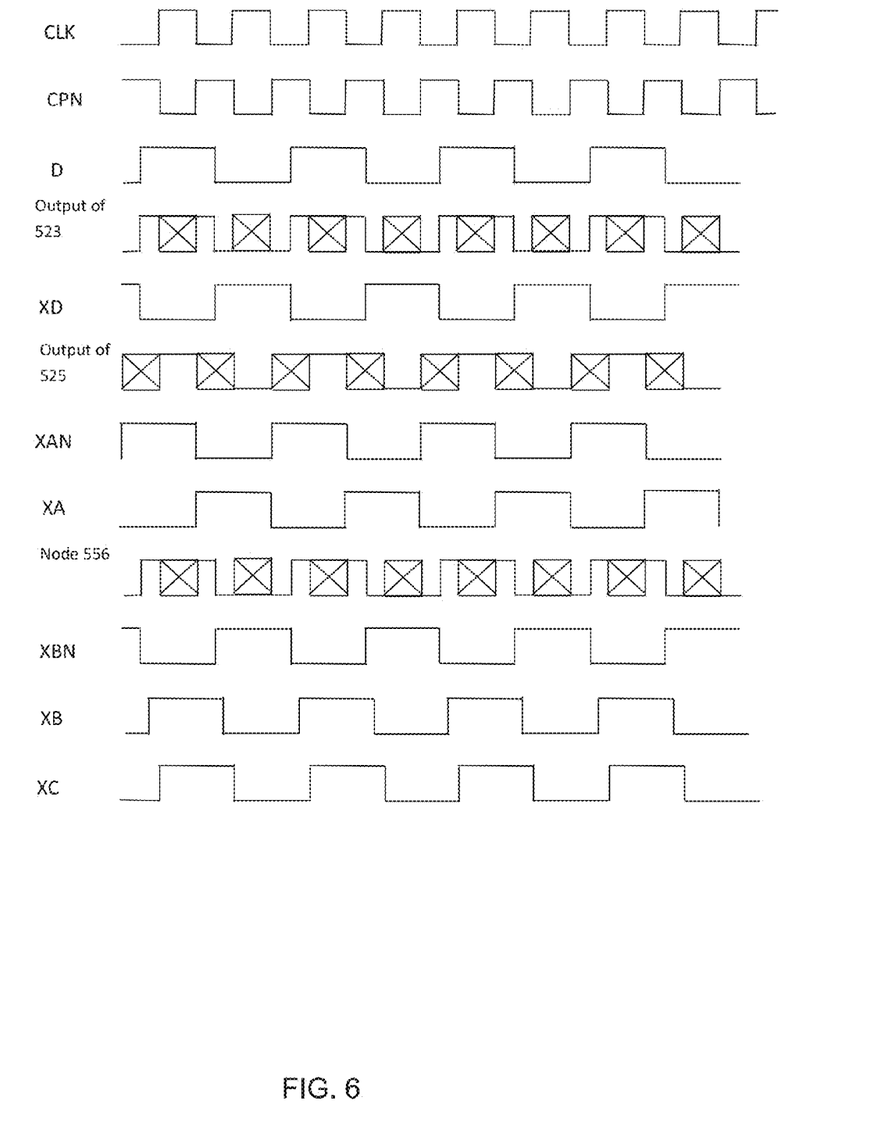
FIG. 6 shows a signal diagram depicting operation the master slave latch of FIG. 5a according to an embodiment.

FIG. 6 shows a signal diagram depicting the operation the master slave latch according to an embodiment. The inverter clock pulse signal CPN is shown as well as CPI corresponding to an inverted CPN. The data signal D is also shown.

In operation, the first tristate inverter 523 of the master latch is in an on-state when CPN is high and CPI is low and the first tristate inverter 523 outputs a signal corresponding to an inverted data signal D. When CPN is low and CPI is high, the first tristate inverter 523 of the master latch is off and does not provide a signal.

The signal from the output of the first tristate inverter 523 of the master latch is provided to the first inverter 524, which inverts the signal and provides XD. The output of the first inverter 524 is provided to the second tristate inverter 525 of the master latch. The second tristate inverter 525 is on when CPN is low and CPI is high and provides an output signal corresponding to an inverted XD. The first inverter inverts the output signal from the second tristate inverter and provides this as an input to the second tristate inverter as well as signal XD.

The signal XD is, therefore, made up of the inverted signal from the first tristate inverter 523 when the CPN is high and the inverted signal from the second tristate inverter 525 when CPN is low. The signal XD may correspond to the inverted data signal D; however, it will be appreciated that a delay may be introduced into the signal due to the propagating through the three inverters of the master latch. It will be appreciated that for clarity this delay has not been shown in FIG. 6.

The slave latch receives the signal XD from the master latch. The slave latch operates similarly to the master latch except that the first tristate inverter 526 of the slave latch is in an on state when CPN is low and CPI is high and the second tristate inverter 527 is in an on-state when CPN is high and CPI is low. In this manner, the master latch may sample the data signal on a falling edge of the clock pulse CP and the data may be latched out of the data latch at the falling edge of the clock pulse CP.

The signal XD is provided to a first monitoring latch and multiplexor circuitry 530. It will be appreciated that this may be similar to the inverter 251, multiplexor 250, and latch 220 of FIG. 2.

The circuitry 530 includes circuitry for selecting an input of the signal XD or a signal XDN corresponding to inverted XD, and for providing this signal to a first inverter 532 and second tristate inverter 533.

The selection circuitry includes a first p-channel transistor 539 with a gate terminal coupled to receive the signal CPI and a drain terminal coupled to a node 556 as well as to a drain terminal of a first n-channel transistor 538 with a gate terminal coupled to receive the signal CPN.

A source terminal of the first p-channel transistor 539 is coupled to respective drain terminals of a second p-channel transistor 551 and a third p-channel transistor 552. A gate terminal of the second p-channel transistor 551 is coupled to receive the XD signal and a gate terminal of the third p-channel transistor 552 is coupled to receive the XDN signal. A source terminal of second p-channel transistor 551 is coupled to a drain terminal of a fourth p-channel transistor 553 with a gate terminal coupled to receive a test mode signal TM and a source terminal coupled to a voltage source. A source terminal of the third p-channel transistor 552 is coupled to a drain terminal of a fifth p-channel transistor 554 with a gate terminal coupled to receive an inverted test mode signal TMN and a source terminal coupled to the voltage source.

A source terminal of the first n-channel transistor 538 is coupled to respective drain terminals of a second n-channel transistor 536 and a third n-channel transistor 537. A gate terminal of the second n-channel transistor 536 is coupled to receive the XD signal and a gate terminal of the third n-channel transistor 537 is coupled to receive the XDN signal.

A source terminal of second n-channel transistor 536 is coupled to a drain terminal of a fourth n-channel transistor 534 with a gate terminal coupled to receive the inverted test mode signal TMN and a source terminal coupled to ground. A source terminal of the third n-channel transistor 537 is coupled to a drain terminal of a fifth n-channel transistor 535 with a gate terminal coupled to receive the test mode signal TM and a source terminal coupled to ground.

The circuitry may include a test-mode-signal inverter 555 for receiving the test-mode signal TM and providing the inverted test-mode signal TMN.

The signal at the node 556 is XBN. The node 556 is coupled to an input of the first inverter 532 of the first latch and outputs a signal XB. The output of the first inverter 532 is coupled to an input of the second tristate inverter 533. The second tristate inverter 533 receives a first control input CPN and a second control input CPI. An output of the second tristate inverter is coupled to the node 556 and the input of the first inverter 532.

When the TM signal is low, a normal mode of operation is selected and the selection circuit operates as a tristate inverter with an input configured to receive the signal XD and a first control input CPI and a second control input CPN. When the TM is high, a test mode of operation is selected and the selection circuit operates as a tristate inverter with an input configured to receive the inverted signal XDN and a first control input CPI and a second control input CPN.

The operation of the selection circuitry can be described by the following table:

TABLE 2

| XD | XDN | TM | TMN | CPI | CPN | Signal at node 556 due to first p-channel transistor 539 | Signal at node 556 due to first n-channel transistor 538 |
|---|---|---|---|---|---|---|---|
| 0 | 1 | 0 | 1 | 0 | 1 | 1 | X |
| 0 | 1 | 0 | 1 | 1 | 0 | X | X |
| 0 | 1 | 1 | 0 | 0 | 1 | X | 0 |
| 0 | 1 | 1 | 0 | 1 | 0 | X | X |
| 1 | 0 | 0 | 1 | 0 | 1 | X | 0 |
| 1 | 0 | 0 | 1 | 1 | 0 | X | X |
| 1 | 0 | 1 | 0 | 0 | 1 | 1 | X |
| 1 | 0 | 1 | 0 | 1 | 0 | X | X |

When the signal CPI is high, CPN is low and the first p-channel transistor 539 and first n-channel transistor 538 are off. In normal mode of operation (TM is low) when CPN is high, the signals TM, TMN, XD and XDN switch their respective transistors on and the output at node 556 is opposite to the input value of XD. In the test mode of operation (when TM is high) and CPN is high, the signals TM, TMN, XD and XDN switch their respective transistors on and the output at node 556 is pulled to the input value of XD.

In normal mode of operation, the selection circuitry behaves like the first tristate inverter 523 of the master latch with the signal XD as an input. In normal mode of operation, the selection circuitry, first inverter 532, and the second tristate inverter 533 operate similarly to the master latch as described above.

In test mode of operation, the signal at the node 556 corresponds to the signal XD. In other words in a test mode of operation, the selection circuitry and the first inverter 532 and second tristate inverter 533 of the first latch operate similarly to the master latch as described above where the input to the latch is an inverted XD signal.

FIG. 6 shows the signal at the node 556 and XBN in a normal mode of operation. The contribution of the selection circuitry to the signal XBN is shown at node 556 and signal XBN is shown with contributions from both the selection circuitry and the second tristate inverter 533 of the first monitoring latch.

The output signal of the first monitoring latch XB is provided to the second monitoring latch 540. The second monitoring latch includes a first tristate inverter 541, a first inverter 542, and a second tristate inverter 543. The outputs of the first tristate inverter 541 and second tristate inverter 543 provide a signal XCN, and the output of the first inverter provides an output XC. It will be appreciated that the second latch is similar to the master latch except that it receives the signal XB as its input and provide a signal XC as its output.

FIG. 6, shows the output XC of the second monitoring latch 540. It will be appreciated that the signals XB and XC may correspond to signal XD from the master latch in normal mode of operation, but be delayed due to the propagation through the latches. In the test mode of operation, the signal XC and XB may correspond to the inverted signal XD.

The signals XB, XC, XA and their inverses XBN, XBCN and XAN are provided to an error-detection circuit to detect if either of the monitoring latches has operated in error.

FIG. 5b shows the error-detection circuit 560 and an error-history circuit 590.

The error-detection circuit includes a first comparison circuit 573 and a second comparison circuit 574.

The first comparison circuit 573 includes a first p-channel transistor 561 with a gate terminal coupled to receive the signal CPN and a drain terminal coupled to a node 572 as well as to a drain terminal of a first n-channel transistor 562 with a gate terminal coupled to receive the signal CPI.

A source terminal of the first p-channel transistor 561 is coupled to respective drain terminals of a second p-channel transistor 563 and a third p-channel transistor 564. A gate terminal of the second p-channel transistor 563 is coupled to receive the XC signal and a gate terminal of the third p-channel transistor 564 is coupled to receive the XCN signal.

A source terminal of second p-channel transistor 563 is coupled to a drain terminal of a fourth p-channel transistor 565 with a gate terminal coupled to receive the signal XAN a source terminal coupled to a voltage source, A source terminal of the third p-channel transistor 564 is coupled to a drain terminal of a fifth p-channel transistor 566 with a gate terminal coupled to receive the signal XA and a source terminal coupled to the voltage source.

A source terminal of the first n-channel transistor 562 is coupled to respective drain terminals of a second n-channel transistor 567 and a third n-channel transistor 568. A gate terminal of the second n-channel transistor 567 is coupled to receive the XC signal and a gate terminal of the third n-channel transistor 568 is coupled to receive the XCN signal.

A source terminal of second n-channel transistor 567 is coupled to a drain terminal of a fourth n-channel transistor 569 with a gate terminal coupled to receive the signal XA and a source terminal coupled to ground. A source terminal of the third n-channel transistor 568 is coupled to a drain terminal of a fifth n-channel transistor 570 with a gate terminal coupled to receive the signal XAN and a source terminal coupled to ground.

The node 572 is further coupled to a drain terminal of a sixth n-channel transistor 571 having a gate terminal coupled to receive the signal CPN and a source terminal coupled to ground.

In operation, the first comparison circuit compares a value of the output of the data latch XA (corresponding to the value of Q) to a value of the output XC of the second monitoring latch 230. If the values are the same, then the first n-channel transistor 562 pulls the node 572 to ground, and if the values are different, then the first p-channel transistor pulls the value of node 572 high. It will be appreciated that the first n-channel transistor 562 and first p-channel transistor 561 only turn on when the signal CPN is low, and when CPN is high, the sixth n-channel transistor pulls the node 572 low.

In this manner, the output of the first comparison circuit 573 is high when the output of the data latch XA and the output of the second monitoring latch 230 XC are different.

Table 3 shows the relationship between the value of the signals of the first comparison circuit 573 and the value at the output node 572.

TABLE 3

| XA | XAN | XC | XCN | CPN | CPI | First p-channel transistor 561 contribution to the output node 572 | First n-channel transistor 562 contribution to the output node 572 | Value at the output node 572 |
|---|---|---|---|---|---|---|---|---|
| 0 | 1 | 0 | 1 | 0 | 1 | X | 0 | 0 |
| 0 | 1 | 0 | 1 | 1 | 0 | X | X | 0 |
| 0 | 1 | 1 | 0 | 0 | 1 | 1 | X | 1 |
| 0 | 1 | 1 | 0 | 1 | 0 | X | X | 0 |
| 1 | 0 | 0 | 1 | 0 | 1 | 1 | X | 1 |
| 1 | 0 | 0 | 1 | 1 | 0 | X | X | 0 |
| 1 | 0 | 1 | 0 | 0 | 1 | X | 0 | 0 |
| 1 | 0 | 1 | 0 | 1 | 0 | X | X | 0 |

The second comparison circuit 574 includes a first p-channel transistor 575 with a gate terminal coupled to receive the signal CPN and a drain terminal coupled to an output node 586 as well as to a drain terminal of a first n-channel transistor 576 with a gate terminal coupled to receive the signal CPI.

A source terminal of the first p-channel transistor 575 is coupled to respective drain terminals of a second p-channel transistor 577 and a third p-channel transistor 578. A gate terminal of the second p-channel transistor 577 is coupled to receive the XB signal and a gate terminal of the third p-channel transistor 578 is coupled to receive the XBN signal.

A source terminal of second p-channel transistor 577 is coupled to a drain terminal of a fourth p-channel transistor 579 with a gate terminal coupled to receive the signal XAN a source terminal coupled to a voltage source, A source terminal of the third p-channel transistor 578 is coupled to a drain terminal of a fifth p-channel transistor 580 with a gate terminal coupled to receive the signal XA and a source terminal coupled to the voltage source.

A source terminal of the first n-channel transistor 576 is coupled to respective drain terminals of a second n-channel transistor 581 and a third n-channel transistor 582. A gate terminal of the second n-channel transistor 581 is coupled to receive the XB signal and a gate terminal of the third n-channel transistor 582 is coupled to receive the XBN signal.

A source terminal of second n-channel transistor 581 is coupled to a drain terminal of a fourth n-channel transistor 583 with a gate terminal coupled to receive the signal XA and a source terminal coupled to ground.

A source terminal of the third n-channel transistor 582 is coupled to a drain terminal of a fifth n-channel transistor 584 with a gate terminal coupled to receive the signal XAN and a source terminal coupled to ground.

The output node 576 is further coupled to a drain terminal of a sixth n-channel transistor 585 having a gate terminal coupled to receive the signal CPN and a source terminal coupled to ground.

In operation, the second comparison circuit 574 compares a value of the output of the data latch XA (corresponding to the value of Q) to a value of the output XB of the first monitoring latch. If the values are the same, then the first n-channel transistor 576 pulls the node 586 to ground and if the values are different, then the first p-channel transistor 575 pulls the value of node 586 high. It will be appreciated that the first n-channel transistor 576 and first p-channel transistor 575 only turn on when the signal CPN is low, and when CPN is high, the sixth n-channel transistor 585 pulls the node 586 low.

In this manner, the output of the second comparison circuit 574 is high when the output of the data latch XA and the output of the first monitoring latch XB are different.

Table 4 shows the relationship between the value of the signals of the second comparison circuit 574 and the value at the output node 586.

TABLE 4

| XA | XAN | XB | XBN | CPN | CPI | First p-channel transistor 575 contribution to the output node 586 | First n-channel transistor 576 contribution to the output node 586 | Value at the output node 586 |
|---|---|---|---|---|---|---|---|---|
| 0 | 1 | 0 | 1 | 0 | 1 | X | 0 | 0 |
| 0 | 1 | 0 | 1 | 1 | 0 | X | X | 0 |
| 0 | 1 | 1 | 0 | 0 | 1 | 1 | X | 1 |
| 0 | 1 | 1 | 0 | 1 | 0 | X | X | 0 |
| 1 | 0 | 0 | 1 | 0 | 1 | 1 | X | 1 |
| 1 | 0 | 0 | 1 | 1 | 0 | X | X | 0 |
| 1 | 0 | 1 | 0 | 0 | 1 | X | 0 | 0 |
| 1 | 0 | 1 | 0 | 1 | 0 | X | X | 0 |

The error-history circuit 590 is coupled to the output node 572 of the first comparison circuit 573 and to the output node 586 of the second comparison circuit and generates a respective first and second flag in response thereto. The error-history circuit 590 includes a first flag-generation circuit 599 and a second flag-generation circuit 600.

The first flag-generation circuit 599 includes a first p-channel transistor 595 with a source terminal coupled to a voltage source, a gate terminal coupled to the output node 572 of the first comparison circuit 573, and a drain terminal coupled to a source terminal of a second p-channel transistor 591. A gate terminal of the second p-channel transistor is coupled to a signal XF2 and a drain terminal is coupled to a drain terminal of a first n-channel transistor 592.

A gate terminal of the first n-channel transistor 592 is coupled to a signal XF2N corresponding to XF2 inverted and a source terminal is coupled to a drain terminal of a second n-channel transistor 593. The gate terminal of the second n-channel transistor 593 is coupled to the output node 572 of the first comparison circuit 573. A source terminal of the second n-channel transistor is coupled to a third n-channel transistor 594 having a gate terminal coupled to a reset flag signal RNF and a source terminal coupled to ground.

The drain terminal of the third n-channel transistor 594 is coupled to a source terminal of a fourth n-channel transistor 610 having a gate terminal coupled to the signal XF2 and a drain coupled to the drain of the second p-channel transistor 591, source of the first n-channel transistor 591 and a drain terminal of a third p-channel transistor 596. A gate terminal of the third p-channel transistor 596 is coupled to the signal RNF and a source terminal is couple to a voltage source.

The drain terminal of the third p-channel transistor 596 coupled to the drain terminal of the fourth n-channel transistor 610 is coupled to a first inverter 597 to provide the XF2N signal. The output of the first inverter 597 provides the XF2 signal. The XF2N signal is further provided to a second inverter 598, which provides a flag signal FLAG2 as an output.

The second flag-generation circuit 600 includes a first p-channel transistor 601 with a source terminal coupled to a voltage source, a gate terminal coupled to the output node 586 of the second comparison circuit 574, and a drain terminal coupled to a source terminal of a second p-channel transistor 602. A gate terminal of the second p-channel transistor 602 is coupled to a signal XF1 and a drain terminal is coupled to a drain terminal of a first n-channel transistor 603.

A gate terminal of the first n-channel transistor 602 is coupled to a signal XF1N corresponding to XF1 inverted and a source terminal is coupled to a drain terminal of a second n-channel transistor 604. The gate terminal of the second n-channel transistor 604 is coupled to the output node 586 of the second comparison circuit 574.

A source terminal of the second n-channel transistor 604 is coupled to a third n-channel transistor 605 having a gate terminal coupled to a reset flag signal RNF and a source terminal coupled to ground. The drain terminal of the third n-channel transistor 605 is coupled to a source terminal of a fourth n-channel transistor 607 having a gate terminal coupled to the signal XF1 and a drain coupled to the drain of the second p-channel transistor 602, source of the first n-channel transistor 603 and a drain terminal of a third p-channel transistor 606. A gate terminal of the third p-channel transistor 606 is coupled to the signal RNF and a source terminal is couple to a voltage source.

The drain terminal of the third p-channel transistor 606 is coupled to the drain terminal of the fourth n-channel transistor 607 and coupled to a first inverter 608 to provide the XF1N signal. The output of the first inverter 608 provides the XF1 signal. The XF1N signal is further provided to a second inverter 609 which provide a flag signal FLAG1 as an output.

It will be appreciated that the first flag-generation circuit 599 is similar to the second flag-generation circuit 600. The operation of the first flag-generation circuit 599 will be described; however it will be appreciated that the second flag-generation circuit 600 may operate accordingly.

When the flag reset signal is asserted, RNF is low and the first flag-generation circuit is ready to generate a flag. The default output of the output node 572 of the first comparison circuit is low until the second latch latches data incorrectly. The low signal RNF turns on the third p-channel transistor 596, pulling the signal XF2N high. The high XF2N is inverted by the first inverter 597 and a low signal XF2. The second inverter 598 also inverts the high signal XF2N and provides a deasserted flag signal FLAG2. The high signal XF2N at the gate terminal of the second p-channel transistor 591 and the low XF2 signal at the gate of the first n-channel transistor 592 enable those transistors to turn on.

The low signal from the output node 572 turns the first p-channel transistor on, and the on first p-channel transistor 595 and on second p-channel transistor 591 pull the signal XF2N high. The third n-channel transistor 594 is off while RNF is low, and the second n-channel transistor is off while the output node 572 signal is low. The fourth n-channel transistor 610 is off because of the low XF2 signal at its gate.

Once the first flag-generation circuit 599 is prepared for a flag assertion, the flag reset signal can be deasserted. The third n-channel transistor 594 is enabled to turn on, but the second n-channel transistor 593 and fourth n-channel transistor 610 remain off. The third p-channel transistor 596 turns off.

The signal XF2N is held high by the on first and second p-channel transistors 595 and 596. When the first comparison circuit determines that the signal XA and XC are different, the signal at the output node 572 goes high. The high output-node 572 signal turns the first p-channel transistor off and the second n-channel transistor 593 on. The second n-channel transistor 593 is coupled to ground via the on third n-channel transistor 594 because of the high signal RNF. The on first, second, and third n-channel transistors 592, 593 and 594 pull the signal XF2N low and XF2 goes high. The high signal XF2 and low signal XF2N turn off the second p-channel transistor 591, and the first n-channel transistor 592 uncouples the first flag generation circuit from the output node 572 signal.

The high XF2 signal turns the fourth n-channel transistor 610 on pulling the signal XF2N low. The signal XF2N is held low and signal XF2 held high by the on third and fourth n-channel transistors 594 and 610. The low XF2N signal is inverted by the second inverter 598 to assert the flag signal FLAG2. It will be appreciated that the FLAG signal is initially asserted by the first, second, and third n-channel transistors 592, 593, and 594 pulling the signal XF2N to ground and is held on by the fourth and third n-channel transistors 594 and 610 being on.

The flag-reset signal may be asserted to reset the flag by turning the third n-channel transistor 594 and the third p-channel transistor 596 on and pulling the signal XF2N high. The XF2N signal is held high by the first and second p-channel transistors 595 and 591a turning on in response to the low XF2 signal and low output node 572 signal. A flag is therefore asserted when a comparison between the output of the data latch XA and output of either of the first and second monitoring latch determines that the output is different. This may indicate that a delay introduced into the output signal of the first or second monitoring latch due to internal latch circuitry has caused the latch to fail.

In the foregoing, the transistors have been depicted as MOSFETS. It will be appreciated that other types or combinations of transistors may be used. It will be appreciated that the latches operate as typical latches or flip-flops in that they clock out a value of a data input to a data output. Although the term latch has been used throughout the description, it will be appreciated that latch may refer to a latch, flip-flop, or any other suitable device.

An embodiment of the circuitry disclosed in FIGS. 2, 4, 5a, and 5b may be disposed on an integrated circuit, which may be coupled to at least one other integrated circuit to form a system. The integrated circuits may be disposed on a same or on respective dies, and at least one of the integrated circuits may be a controller such as a microcontroller or microprocessor.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
a logic circuit configured to receive a data input signal and generate a data output signal in response to the data input signal and a transition of a clock signal;
a monitor configured to receive an input signal based upon a delay of the data input signal, and configured to generate a first monitor signal in response to the input signal and the transition of the clock signal; and
a determiner configured to determine from the data output signal, the first monitor signal, and the transition of the clock signal whether the input signal transitions within an error time window around the transition of the clock signal.

2. The apparatus of claim 1 wherein the monitor includes a latch configured to receive the input signal and to generate the first monitor signal in response to the input signal.

3. The apparatus of claim 1 wherein the monitor includes a flip flop configured to receive the input signal and to generate the first monitor signal in response to the input signal.

4. The apparatus of claim 1 wherein the monitor includes a latch configured to receive the input signal, to receive the clock signal, and to generate the first monitor signal in response to the input and clock signals.

5. The apparatus of claim 1 wherein:
the monitor is configured to generate a second monitor signal in response to the input signal; and
the determiner is also configured to determine whether the input signal transitions within an error time window around the transition of the clock signal from the second monitor signal.

6. The apparatus of claim 5 wherein the monitor includes:
a first latch configured to receive the input signal and to generate the first monitor signal in response to the input signal; and
a second latch configured to receive the first monitor signal and to generate the second monitor signal in response to the first monitor signal.

7. The apparatus of claim 5 wherein the monitor includes:
a first latch configured to receive the input signal, to receive the clock signal, and to generate the first monitor signal in response to the input and clock signals; and
a second latch configured to receive the first monitor signal, to receive the clock signal, and to generate the second monitor signal in response to the first monitor signal and the clock signal.

8. The apparatus of claim 1 wherein the transition of the clock signal comprises one of a rising edge and a falling edge.

9. The apparatus of claim 1, further comprising a latch configured to generate the input signal.

10. The apparatus of claim 1, further comprising:
a first latch configured to generate the input signal;
a second latch configured to generate an output signal in response to the input signal; and
wherein the determiner is also configured to determine whether the input signal transitions within an error time window around the transition of the clock signal from the output signal.

11. The apparatus of claim 1, further comprising:
a first latch configured to generate the input signal in response to the clock signal;
a second latch configured to generate an output signal in response to the input signal and in response to a complement of the clock signal; and
wherein the determiner is also configured to determine whether the input signal transitions within an error time window around the transition of the clock signal in response to the complement of the clock signal and the output signal.

12. The apparatus of claim 1, further comprising:
a first latch configured to generate the input signal in response to the clock signal;
a second latch configured to generate an output signal in response to the input signal and in response to a complement of the clock signal;
wherein the monitor includes
a third latch configured to generate the first monitor signal in response to the clock signal and the input signal, and
a fourth latch configured to generate a second monitor signal in response to the clock signal and the first monitor signal; and
wherein the determiner is also configured to determine whether the input signal transitions within an error time window around the transition of the clock signal from the complement of the clock signal, the output signal, and the second monitor signal.

13. An integrated circuit, comprising:
a latch configured to generate an input signal;
a monitor configured to receive the input signal, and configured to generate a monitor signal in response to the input signal and a transition of a clock signal; and
a determiner configured to determine from the monitor signal and the transition of the clock signal whether the input signal transitions within an error time window around the transition of the clock signal.

14. A system, comprising:
a first integrated circuit, including
a latch configured to generate an input signal,
a monitor configured to receive the input signal, and configured to generate a monitor signal in response to the input signal and a transition of a clock signal, and
a determiner configured to determine from the monitor signal and the transition of the clock signal whether the input signal transitions within an error time window around the transition of the clock signal; and
a second integrated circuit coupled to the first integrated circuit to form a system.

15. The system of claim 14 wherein the first and second integrated circuits are disposed on a same die.

16. The system of claim 14 wherein the first and second integrated circuits are disposed on respective dies.

17. The system of claim 14 wherein one of the first and second integrated circuits includes a controller.

18. A method, comprising:
generating an input signal with a first latch in response to a clock signal;
generating a first monitor signal in response to the input signal and the clock signal; and
determining a proximity of the first latch to an improper operating state in response to the monitor signal and a complement to the clock signal, the proximity of the first latch to the improper operating state indicating a margin of error separating a current operating state of the first latch from the improper operating state.

19. The method of claim 18 wherein determining the proximity of the first latch to an improper operating state includes:
determining that the first latch is a first measure away from an improper operating state if the monitor signal equals the input signal; and
determining that the first latch is a second measure away from an improper operating state if the monitor signal does not equal the input signal, the second measure being smaller than the first measure.

20. The method of claim 18, further comprising:
generating a second monitor signal in response to the first monitor signal; and
wherein determining the proximity of the first latch to an improper operating state includes
determining that the first latch is a first measure away from an improper operating state if the first and second monitor signals equal the input signal,
determining that the first latch is a second measure away from an improper operating state if the first monitor signal equals the input signal and the second monitor signal does not equal the input signal, the second measure being smaller than the first measure, and
determining that the first latch is a third measure away from an improper operating state if the first and second monitor signals do not equal the input signal, the third measure being smaller than the first and second measures.

* * * * *